(12) United States Patent
Yoon et al.

(10) Patent No.: US 11,991,493 B2
(45) Date of Patent: May 21, 2024

(54) MICROPHONE PACKAGE AND ELECTRONIC APPARATUS INCLUDING THE SAME

(71) Applicant: SAMSUNG ELECTRONICS CO., LTD., Suwon-si (KR)

(72) Inventors: Yongseop Yoon, Seoul (KR); Cheheung Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 95 days.

(21) Appl. No.: 17/734,677

(22) Filed: May 2, 2022

(65) Prior Publication Data
US 2023/0199358 A1    Jun. 22, 2023

(30) Foreign Application Priority Data

Dec. 22, 2021    (KR) .................... 10-2021-0185411

(51) Int. Cl.
*H04R 1/04* (2006.01)
*H04R 1/08* (2006.01)
*H04R 1/34* (2006.01)

(52) U.S. Cl.
CPC ............. *H04R 1/04* (2013.01); *H04R 1/083* (2013.01); *H04R 1/342* (2013.01)

(58) Field of Classification Search
CPC ...... H04R 17/02; H04R 17/10; H04R 17/025; H04R 19/005; H04R 2201/003; H04R 23/006; H04R 1/406; H04R 19/04; H04R 1/04; H04R 11/14; H04R 11/04
See application file for complete search history.

(56) References Cited

U.S. PATENT DOCUMENTS

| | | |
|---|---|---|
| 5,554,806 A | 9/1996 | Mizuno et al. |
| 5,856,722 A | 1/1999 | Haronian et al. |
| 8,103,027 B2 | 1/2012 | Zhang et al. |
| 8,170,244 B2 | 5/2012 | Ryan et al. |
| 9,148,729 B2 | 9/2015 | Josefsson |
| 9,479,884 B2 | 10/2016 | Kim |
| 10,141,007 B1 | 11/2018 | Kim et al. |
| 10,225,662 B2 | 3/2019 | Kim |

(Continued)

FOREIGN PATENT DOCUMENTS

| | | |
|---|---|---|
| EP | 3 506 654 A1 | 7/2019 |
| JP | 5-59875 U | 8/1993 |

(Continued)

OTHER PUBLICATIONS

Communication dated Nov. 18, 2022, issued by the European Patent Office in European Application No. 22174219.0.

*Primary Examiner* — Kile O Blair
(74) *Attorney, Agent, or Firm* — Sughrue Mion, PLLC

(57) ABSTRACT

A microphone package and an electronic apparatus including the same are provided. The microphone package includes a substrate in which an acoustic hole and a via hole are formed; an acoustic sensor attached to a front surface of the substrate and covering the acoustic hole; a first electrode pad provided on the front surface of the substrate; a second electrode pad provided on a rear surface of the substrate and electrically connected to the first electrode pad through the via hole; and a third electrode pad on a side surface of the substrate and electrically connected to the second electrode pad.

28 Claims, 11 Drawing Sheets

(56) References Cited

U.S. PATENT DOCUMENTS

| | | |
|---|---|---|
| 10,447,238 B2 | 10/2019 | Kang et al. |
| 10,528,069 B2 | 1/2020 | Hong et al. |
| 10,566,011 B2 | 2/2020 | Park et al. |
| 10,742,190 B2 | 8/2020 | Yoon et al. |
| 10,756,746 B2 | 8/2020 | Hong et al. |
| 10,823,814 B2 | 11/2020 | Kang et al. |
| 11,039,262 B2 | 6/2021 | Kim et al. |
| 11,341,973 B2 | 5/2022 | Kim et al. |
| 2012/0080764 A1 | 4/2012 | Xue |
| 2012/0106112 A1 | 5/2012 | Knies et al. |
| 2019/0145806 A1 | 5/2019 | Lim et al. |
| 2019/0200119 A1* | 6/2019 | Kang ..................... H04R 7/04 |
| 2020/0212885 A1 | 7/2020 | Kim et al. |

FOREIGN PATENT DOCUMENTS

| | | |
|---|---|---|
| JP | 2006-78250 A | 3/2006 |
| JP | 2009-264760 A | 11/2009 |
| JP | 4869856 B2 | 2/2012 |

\* cited by examiner

MICROPHONE PACKAGE AND ELECTRONIC APPARATUS INCLUDING THE SAME

CROSS-REFERENCE TO RELATED APPLICATION

This application is based on and claims priority under 35 U.S.C. § 119 to Korean Patent Application No. 10-2021-0185411, filed on Dec. 22, 2021, in the Korean Intellectual Property Office, the disclosure of which is incorporated by reference herein in its entirety.

BACKGROUND

1. Field

Embodiments of the present disclosure relate to a microphone package and an electronic apparatus including the same.

2. Description of the Related Art

A microphone is a device that is mounted on an acoustic apparatus such as an earphone or a headphone, a smart device such as a smartphone or tablet PC, an image display apparatus such as a television (TV), a virtual reality (VR) apparatus, an augmented reality (AR) apparatus, an artificial intelligence (AI) speaker, etc., to detect a direction from which a sound comes and to recognize a voice.

In general, a microphone is attached to a substrate such as a printed circuit board (PCB) and manufactured as a package, and such a microphone package is mounted on a main board of an electronic apparatus to serve as a voice interface.

SUMMARY

Provided are a microphone package and an electronic apparatus including the same.

Additional aspects will be set forth in part in the description which follows and, in part, will be apparent from the description, or may be learned by practice of the presented embodiments of the disclosure.

According to an aspect of an example embodiment, there is provided a microphone package including: a substrate in which an acoustic hole and a via hole are formed; an acoustic sensor attached to a front surface of the substrate and covering the acoustic hole; a first electrode pad provided on the front surface of the substrate; a second electrode pad provided on a rear surface of the substrate and electrically connected to the first electrode pad through the via hole; and a third electrode pad provided on a side surface of the substrate and electrically connected to the second electrode pad.

The microphone package may further include a ground pattern provided on the front surface of the substrate and surrounding the acoustic hole and the via hole, the ground pattern being electrically connected to the first electrode pad.

The microphone package may further include a cap provided on the front surface of the substrate and covering the acoustic sensor.

The cap may further include a conductive material and is electrically connected to the ground pattern.

The substrate may include an insulating material.

The microphone package may further include a sensor control chip provided on the front surface of the substrate, the sensor control chip being configured to transmit and receive an electrical signal to and from the acoustic sensor.

The sensor control chip may be electrically connected to the first electrode pad.

The acoustic hole may include a plurality of through holes arranged in an array.

A trench may be formed in the front surface of the substrate, and the acoustic sensor may be provided in the trench.

The acoustic sensor may include a directional acoustic sensor.

The directional acoustic sensor may include: a support; and a plurality of resonators that extend from the support in a longitudinal direction.

A cavity may be formed through the support, and the plurality of resonators may be arranged in the cavity.

Each resonator of the plurality of resonators may have a resonant frequency that is different from resonant frequencies of other resonators of the plurality of resonators.

Each resonator of the plurality of resonators may have at least one dimension that is different from dimensions of other resonators of the plurality of resonators.

According to an aspect of the disclosure, there is provided an electronic apparatus including: a main board; and a microphone package mounted on the main board, wherein the microphone package includes: a substrate in which an acoustic hole and a via hole are formed; an acoustic sensor attached to a front surface of the substrate and covering the acoustic hole; a first electrode pad provided on the front surface of the substrate; a second electrode pad provided on a rear surface of the substrate and electrically connected to the first electrode pad through the via hole; and a third electrode pad provided on a side surface of the substrate and electrically connected to the second electrode pad.

The microphone package may be mounted in a direction parallel to the main board.

The second electrode pad may be in contact with the main board.

The microphone package may be mounted in a direction perpendicular to the main board.

The third electrode pad may contact the main board.

The microphone package may further include a ground pattern provided on the front surface of the substrate and surrounding the acoustic hole and the via hole, the ground pattern being electrically connected to the first electrode pad.

The microphone package may further include a cap provided on the front surface of the substrate and covering the acoustic sensor.

The microphone package may further include a sensor control chip provided on the front surface of the substrate, the sensor control chip being configured to transmit and receive an electrical signal to and from the acoustic sensor.

The acoustic hole may include a plurality of through holes arranged in an array.

A trench may be formed in the front surface of the substrate to a depth, and the acoustic sensor is within the trench.

The acoustic sensor may include a directional acoustic sensor.

The directional acoustic sensor may include: a support; and a plurality of resonators that extend from the support in a longitudinal direction.

Each resonator of the plurality of resonators may have a resonant frequency that is different from resonant frequencies other resonators of the plurality of resonators.

The electronic apparatus may be an earphone, a headphone, a smart phone, a tablet PC, a television (TV), a virtual reality (VR) apparatus, an augmented reality (AR) apparatus, or an artificial intelligence (AI) speaker.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
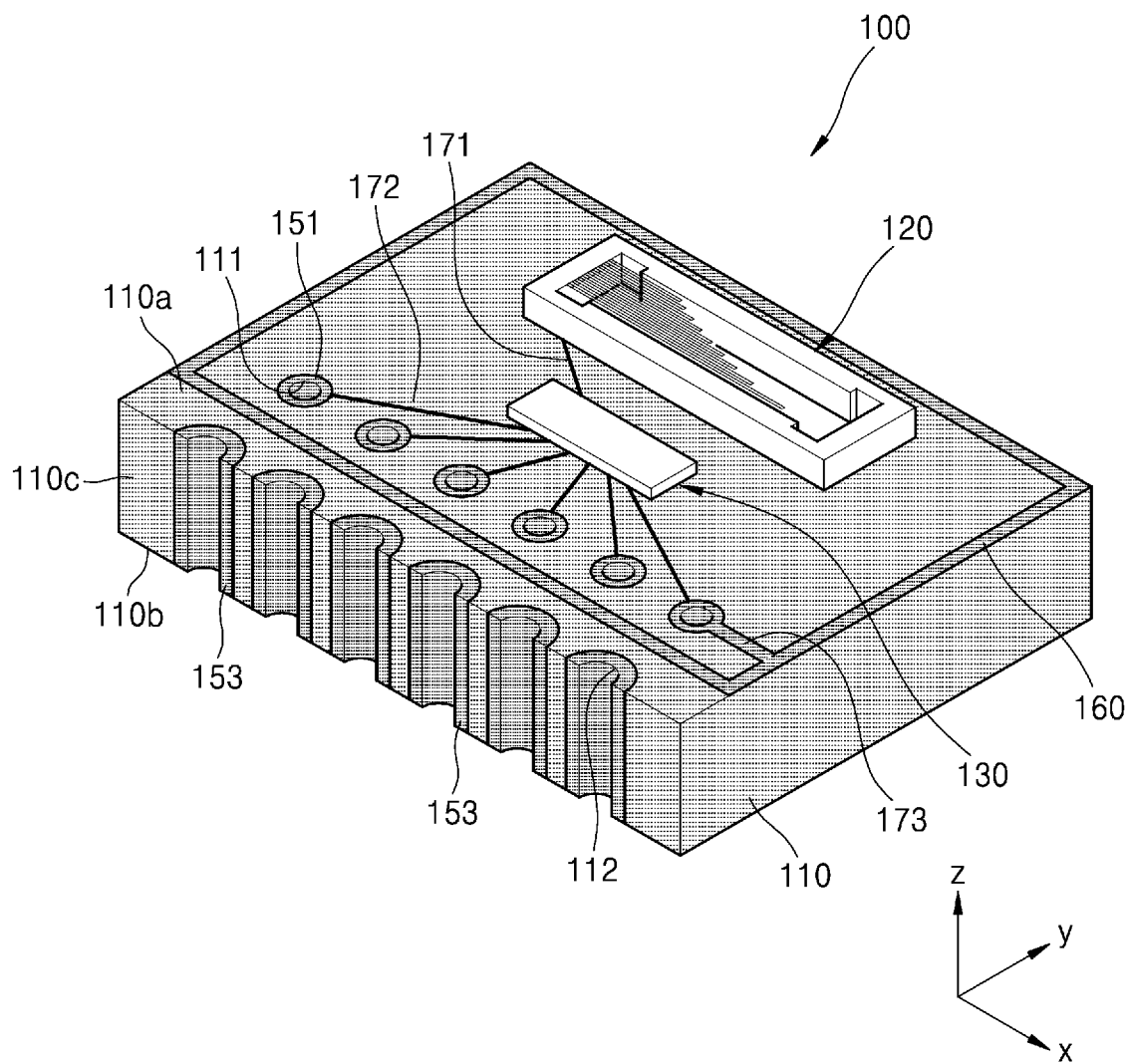
FIG. 1 is a perspective view illustrating a microphone package according to an embodiment.

Reference will now be made in detail to embodiments, examples of which are illustrated in the accompanying drawings, wherein like reference numerals refer to like elements throughout. In this regard, embodiments of the present disclosure may have different forms and should not be construed as being limited to the descriptions set forth herein. Accordingly, the embodiments described below, with reference to the figures, are non-limiting example embodiments for explaining aspects of the present disclosure. As used herein, the term "and/or" includes any and all combinations of one or more of the associated listed items. Expressions such as "at least one of," when preceding a list of elements, modify the entire list of elements and do not modify the individual elements of the list.

The size of each element in the drawings may be exaggerated for clarity and convenience of description. Meanwhile, embodiments described below are merely examples, and various modifications may be to these embodiments.

Hereinafter, what is described as "above" or "on" may include those directly on, underneath, left, and right in contact, as well as above, below, left, and right in non-contact. The singular forms are intended to include the plural forms as well, unless the context clearly indicates otherwise. Also, when a part "includes" any element, it means that the part may further include other elements, rather than excluding other elements, unless otherwise stated.

The term "the" and the similar indicative terms may be used in both the singular and the plural. If there is no explicit description of the order of steps constituting a method or no contrary description thereto, these steps may be performed in any appropriate order, and are not limited to the order described.

In addition, the terms ". . . unit", "module", etc. described herein mean a unit that processes at least one function or operation, may be implemented as hardware or software, or may be implemented as a combination of hardware and software.

Connections of lines or connection members between elements shown in the drawings are illustrative of functional connections and/or physical or circuitry connections, and may be replaced in an actual device, or may be represented as additional various functional connections, physical connections, or circuitry connections.

The use of all examples or example terms is merely for describing the present disclosure in detail, and the scope of the present disclosure is not limited by these examples.

FIG. 1 is a perspective view illustrating a microphone package 100 according to an embodiment.

Referring to FIG. 1, the microphone package 100 includes a substrate 110, an acoustic sensor 120 attached to a front surface 110a of the substrate 110, and a sensor control chip 130. The substrate 110 may include an insulating material. The substrate 110 may include, for example, a printed circuit board (PCB). The acoustic sensor 120 is an element capable of detecting a direction in which a sound comes and recognizing the sound, and may include, for example, a directional acoustic sensor that converts a mechanical movement caused by a pressure difference into an electrical signal and detects an acoustic signal.

The sensor control chip 130 transmits and receives electrical signals to and from the acoustic sensor 120, and may include, for example, an application specific integrated circuit (ASIC). The sensor control chip 130 may be electrically connected to the acoustic sensor 120 through a first metal pattern 171 formed on the front surface 110a of the substrate 110. However, embodiments of the present disclosure are not limited thereto, and the sensor control chip 130 may be electrically connected to the acoustic sensor 120, for example, through wire bonding.

The sensor control chip 130 may be electrically connected to first electrode pads 151, which will be described below, through a second metal pattern 172 formed on the front surface 110a of the substrate 110. However, embodiments of the present disclosure are not limited thereto, and the sensor control chip 130 may be electrically connected to the first electrode pads 151, for example, through wire bonding.

Figure 2:
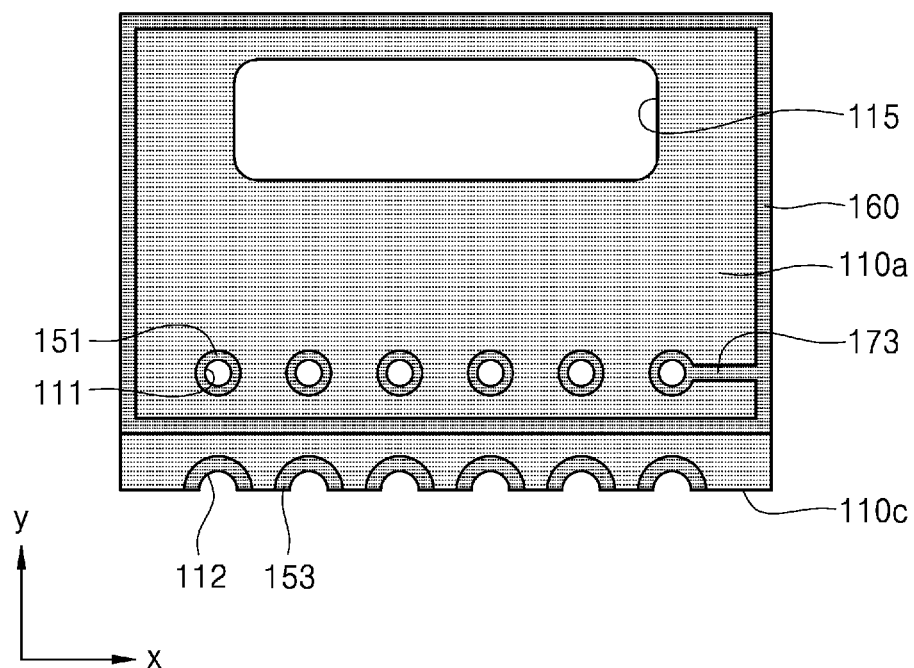
FIG. 2 is a front view of a substrate in the microphone package shown in FIG. 1.
Figure 3:
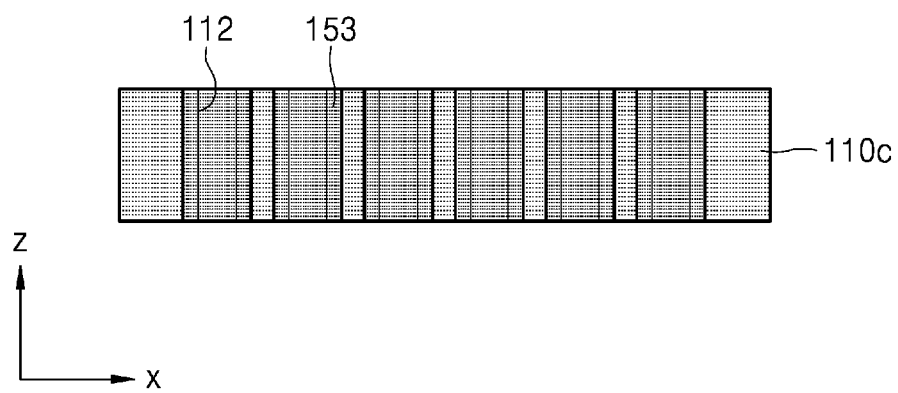
FIG. 3 is a side view of the substrate in the microphone package shown in FIG. 1.
Figure 4:
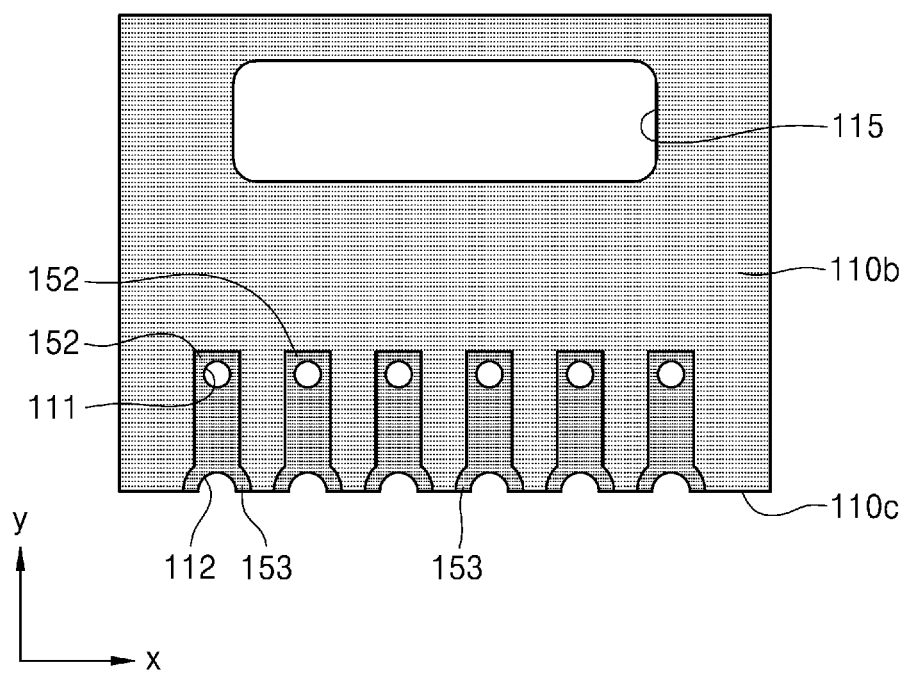
FIG. 4 is a rear view of the substrate in the microphone package shown in FIG. 1.

FIG. 2 is a front view of the substrate 110 in the microphone package 100 shown in FIG. 1, FIG. 3 is a side view of the substrate 110, and FIG. 4 is a rear view of the substrate 110.

Referring to FIGS. 2 to 4, an acoustic hole 115 that forms a sound path in a region to which the acoustic sensor 120 is attached is formed through the substrate 110. As shown in FIG. 1, the acoustic sensor 120 may be attached to the front surface 110a of the substrate 110 to be aligned with the acoustic hole 115. For example, the acoustic sensor 120 may be attached to the front surface 110a of the substrate 110 to cover the acoustic hole 115.

A plurality of first via holes 111 are formed through the substrate 110. As shown in FIG. 2, the first electrode pads 151 are provided on the front surface 110a of the substrate 110 around each of the first via holes 111. In addition, as shown in FIG. 4, second electrode pads 152 are provided on a rear surface 110b of the substrate 110 around each of the first via holes 111. The first electrode pads 151 and the second electrode pads152 may include a metal material having excellent conductivity.

The first electrode pads 151 and the second electrode pads 152 may be provided to be electrically connected to each other by a conductive material that fills the inside of the first via holes 111. FIGS. 2 and 4 illustrate a case in which a conductive material is provided to fill a part of the inside of the first via holes 111, but this is only an example. The conductive material may be provided to fill the entire inside of the first via holes 111 so that the first electrode pads 151 and the second electrode pads152 may be electrically connected to each other.

A ground pattern 160 may be provided on the front surface 110a of the substrate 110 to surround the acoustic hole 115 and the first via holes 111. Here, the ground pattern 160 may be electrically connected to some of the first electrode pads 151 through a third metal pattern 173 formed on the front surface 110a of the substrate 110.

A plurality of second via holes 112 are formed in a side surface 110c of the substrate 110, and third electrode pads 153 are respectively provided inside each of the second via holes 112. Like the first electrode pads 151 and the second electrode pads 152, the third electrode pads 153 may include a metal material having excellent conductivity.

In the drawings, a case in which each of the second via holes 112 has a semicircular cross-sectional shape is illustrated. However, this is only an example, and the second via holes 112 may be formed in various shapes. In addition, a case in which the third electrode pads 153 are provided to fill a part of the inside of the second via holes 112 is illustrated in the drawings, but embodiments of the present disclosure are not limited thereto. The third electrode pads 153 may be respectively provided to fill the entire inside of the second via holes 112. As shown in FIG. 4, the third electrode pads 153 provided on the side surface 110c of the substrate 110 may be provided to be electrically connected to the second electrode pads 152 provided on the rear surface 110b of the substrate 110.

As described above, the first electrode pads 151 provided on the front surface 110a of the substrate 110 may be electrically connected to the second electrode pads 152 provided on the rear surface 110b of the substrate 110 through the first via holes 111. In addition, the second electrode pads 152 provided on the rear surface 110b of the substrate 110 may be electrically connected to the third electrode pads 153 provided on the side surface 110c of the substrate 110. Accordingly, the first electrode pads 151 may be electrically connected to the third electrode pads 153 through the second electrode pads 152.

Figure 5:
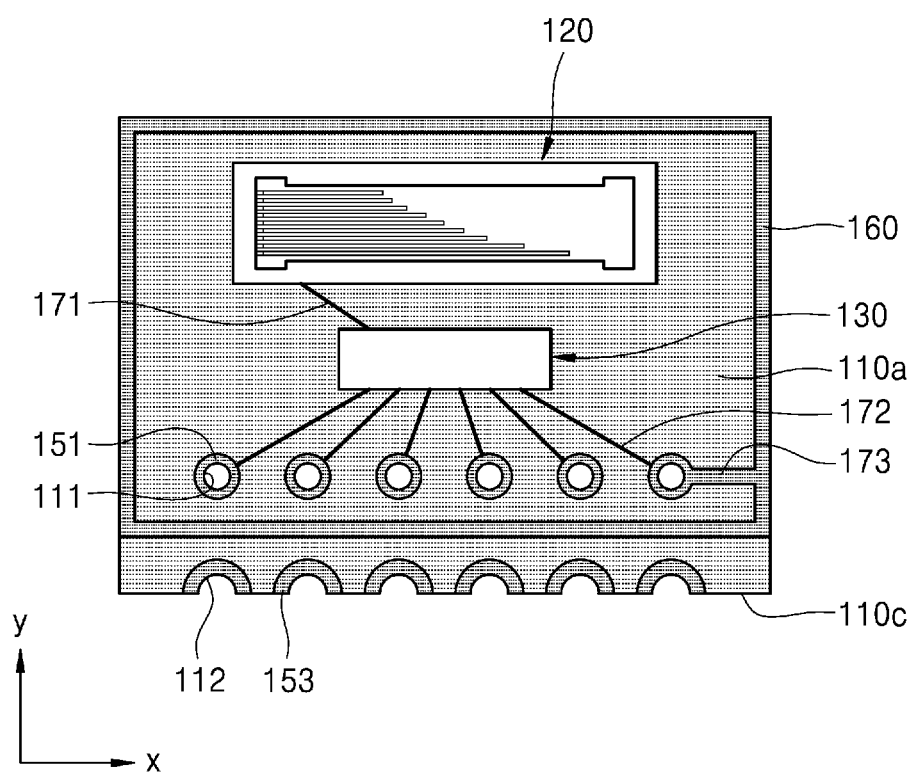
FIG. 5 illustrates an acoustic sensor and a sensor control chip attached to a front surface of the substrate shown in FIG. 2.

FIG. 5 illustrates the acoustic sensor 120 and the sensor control chip 130 attached to the front surface 110a of the substrate 110 shown in FIG. 2.

Referring to FIG. 5, the acoustic sensor 120 is attached to the front surface 110a of the substrate 110 to cover the acoustic hole 115 formed in the substrate 110. The sensor control chip 130 is attached to the front surface 110a of the substrate 110 at a side of the acoustic sensor 120. The sensor control chip 130 may be electrically connected to the acoustic sensor 120 through the first metal pattern 171, and may be electrically connected to the first electrode pads 151 through the second metal pattern 172.

Figure 6:
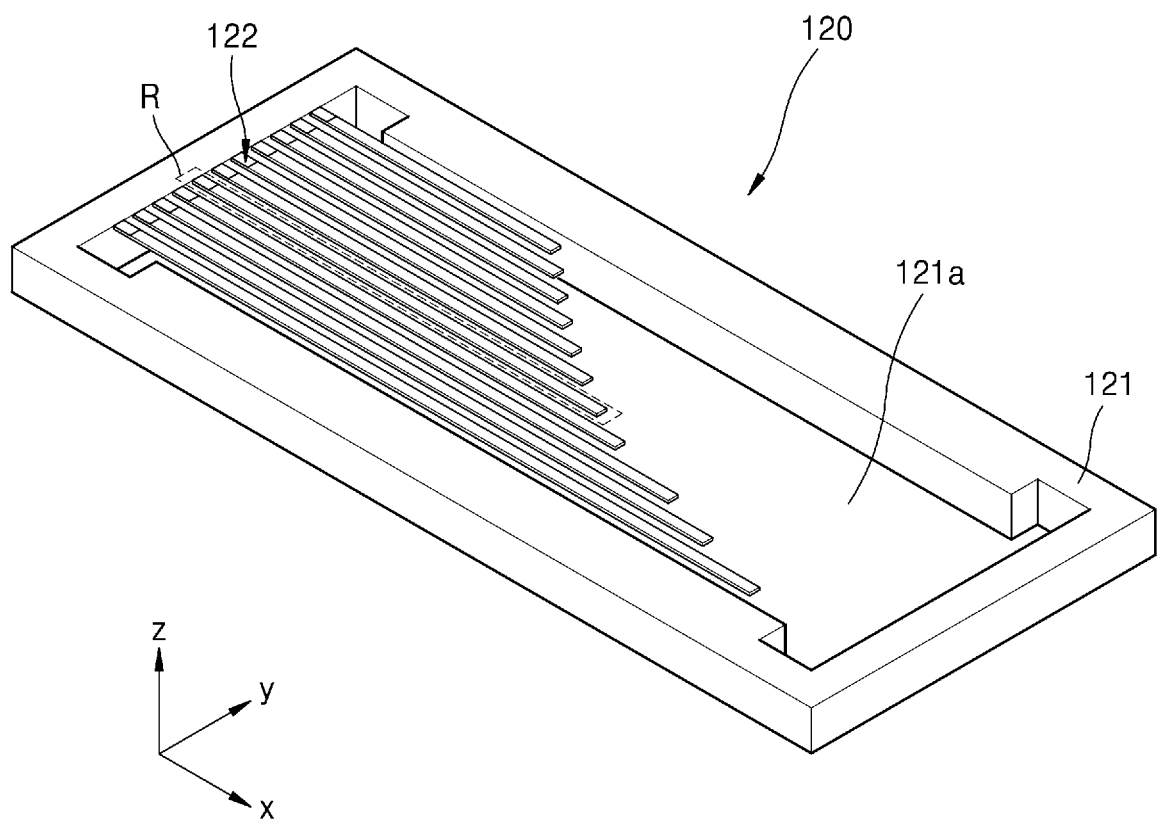
FIG. 6 is a perspective view illustrating an example of the acoustic sensor shown in FIG. 1.
Figure 7:
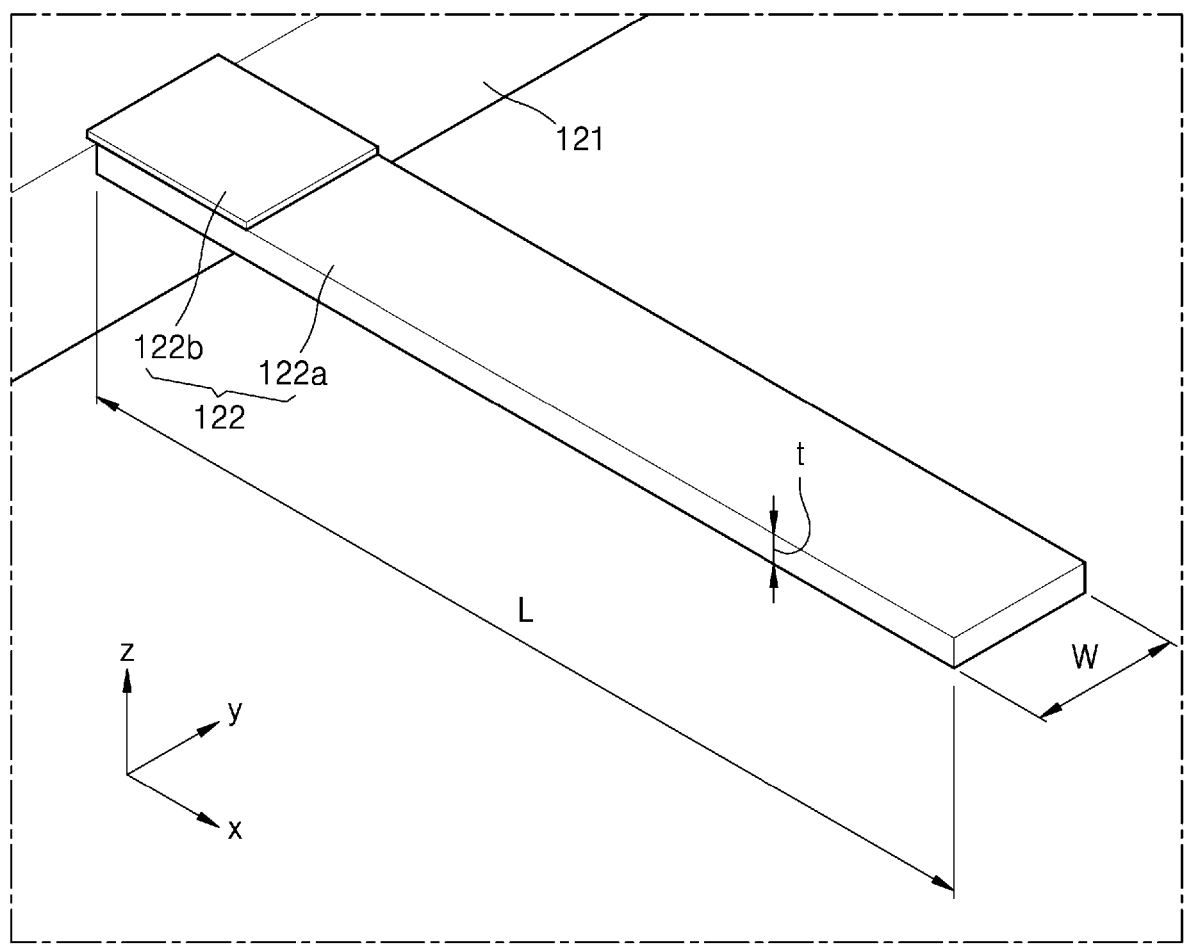
FIG. 7 is an enlarged view of a part R of FIG. 6.

FIG. 6 is a perspective view illustrating an example of the acoustic sensor 120 shown in FIG. 1, and FIG. 7 is an enlarged view of a part R of FIG. 6. The acoustic sensor 120 illustrated in FIG. 6 may be a directional acoustic sensor that converts a mechanical movement caused by a pressure difference into an electrical signal and detects an acoustic signal.

Referring to FIGS. 6 and 7, the acoustic sensor 120 includes a support 121 and a plurality of resonators 122 provided on the support 121. A cavity 121a is formed through the support 121, and the plurality of resonators 122 may be arranged in a certain shape on the cavity 121a.

Each of the resonators 122 may form a cantilever beam having one end fixed to the support 121 and another end that may move freely. Each of the resonators 122 includes a driving unit 122a that moves in response to an input acoustic signal, and a sensing unit 122b that detects a movement of the driving unit 122a. Here, the driving unit 122a may be provided to extend from the support 121 toward the cavity 121a in a longitudinal direction (an x-axis direction in FIG. 6) of each of the resonators 122. The sensing unit 122b may be provided on one surface of the driving unit 122a to detect the movement of the driving unit 122a. The sensing unit 122b may include a piezoelectric element that generates electric energy due to deformation of a piezoelectric body.

Each of the resonators 122 (specifically, the driving unit 122a) may have a certain length L, a width W, and a thickness t. The plurality of resonators 122 may be configured to have resonance frequencies different from each other. To this end, the plurality of resonators 122 may be provided to have dimensions different from each other. For example, the plurality of resonators 122 may be provided to have lengths, widths, or thicknesses different from each other. FIG. 6 illustrates a case in which the plurality of resonators 122 have lengths different from each other.

Figure 8:
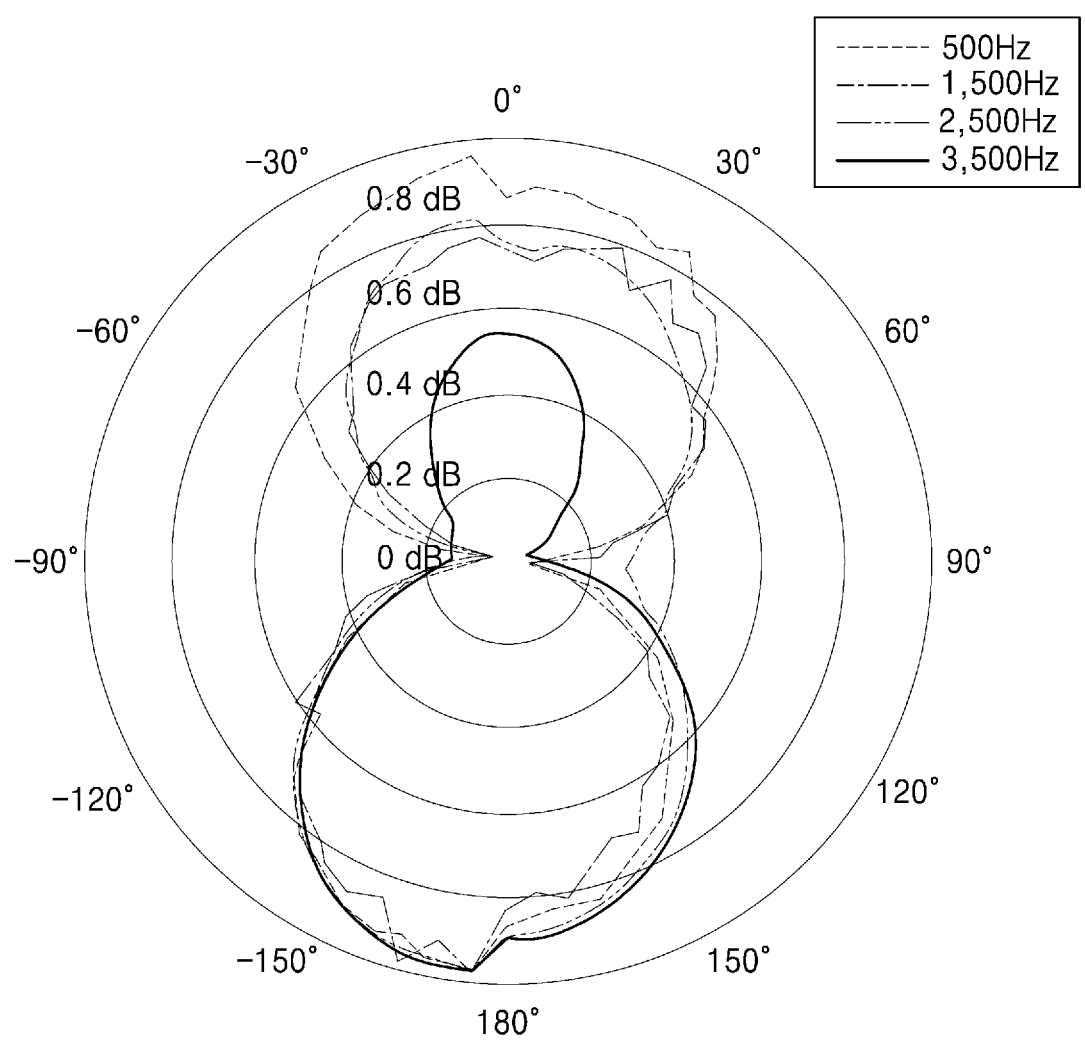
FIG. 8 illustrates an example of results of measuring directional characteristics of the acoustic sensor shown in FIG. 6.
Figure 9:
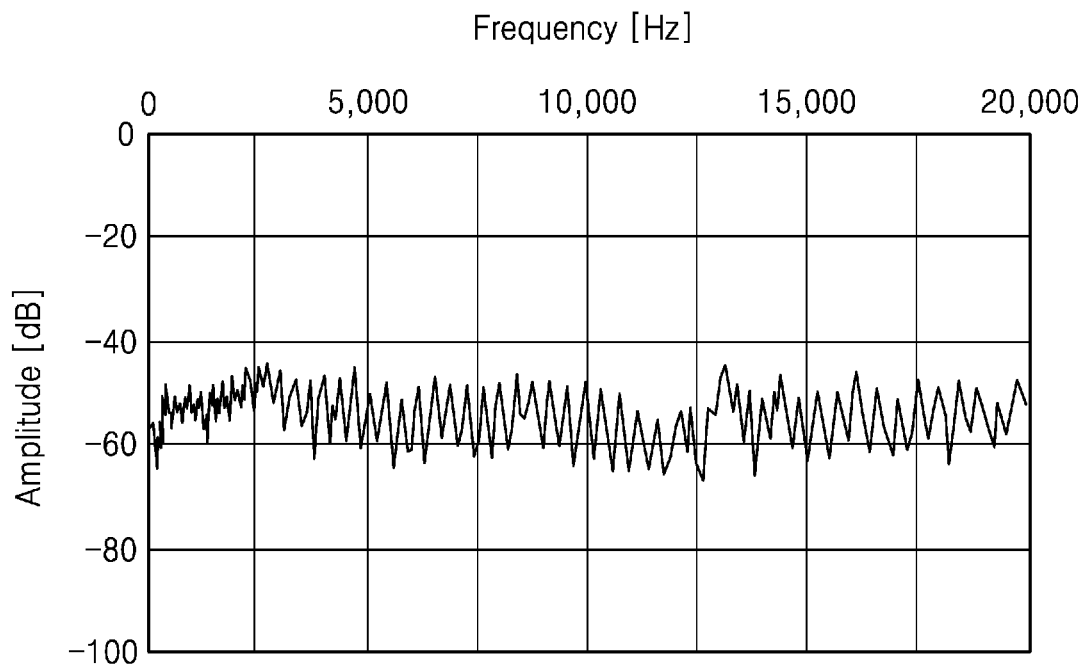
FIG. 9 illustrates an example of results of measuring frequency response characteristics of the acoustic sensor shown in FIG. 6.

FIG. 8 illustrates an example of results of measuring directional characteristics of the acoustic sensor 120 shown in FIG. 6. As shown in FIG. 8, it may be seen that the acoustic sensor 120 has bi-directionality, that is, directionality in a z-axis direction, which is a 0 degree direction and a 180 degree direction. FIG. 9 illustrates an example of results of measuring frequency response characteristics of the acoustic sensor 120 shown in FIG. 6. The acoustic sensor 120 illustrated in FIGS. 6 to 9 described above is merely an example, and other various acoustic sensors may be applied to the microphone package 100 according to an embodiment.

Figure 10:
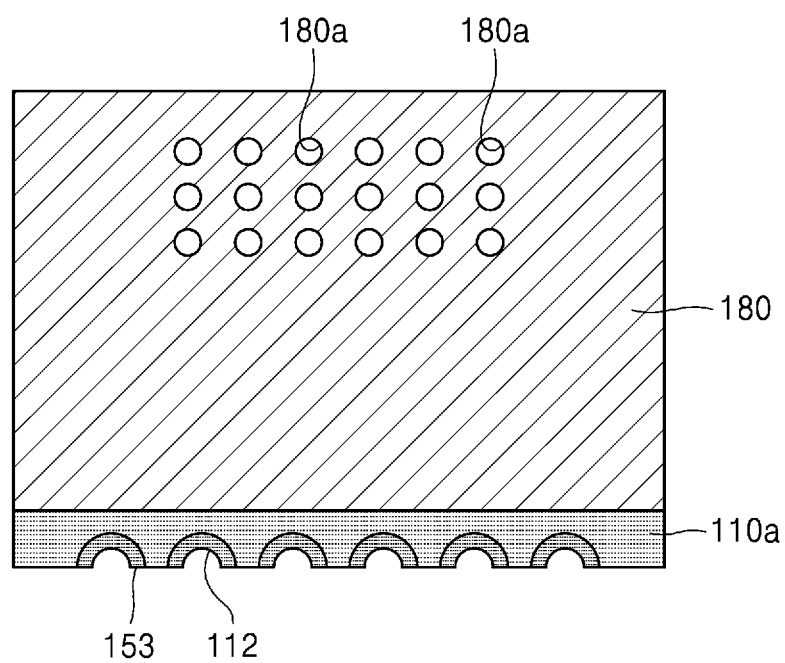
FIG. 10 illustrates a cap provided on a front surface of a substrate so as to cover an acoustic sensor and a sensor control chip in the microphone package shown in FIG. 1.

FIG. 10 illustrates a cap 180 provided on the front surface 110a of the substrate 110 so as to cover the acoustic sensor 120 and the sensor control chip 130 in the microphone package 100 shown in FIG. 1.

Referring to FIG. 10, the cap 180 is for protecting the acoustic sensor 120 and the sensor control chip 130, and may be attached to the front surface 110a of the substrate 110 to cover the acoustic sensor 120 and the sensor control chip 130. Here, the cap 180 may be provided to contact the ground pattern 160 formed on the front surface 110a of the substrate 110. The cap 180 may include a conductive material such as a metal material for grounding. In addition, a plurality of through holes 180*a* forming a sound path may be formed in the cap 180.

The microphone package 100 according to an embodiment described above may be mounted on a main board of an electronic apparatus such as an acoustic apparatus, a smart device, an image display apparatus, a virtual reality (VR) apparatus, an augmented reality (AR) apparatus, an artificial intelligence (AI) speaker, etc. to serve as a voice interface. As a specific example, an electronic apparatus to which the microphone package 100 according to an embodiment may be applied is an earphone, a headphone, a smartphone, a tablet PC, a TV, a VR apparatus, an AR apparatus, or an AI speaker, etc., but is not limited thereto.

In general, the microphone package 100 may be mounted on the main board in the electronic apparatus using a surface mounting technology (SMT).

Figure 11:
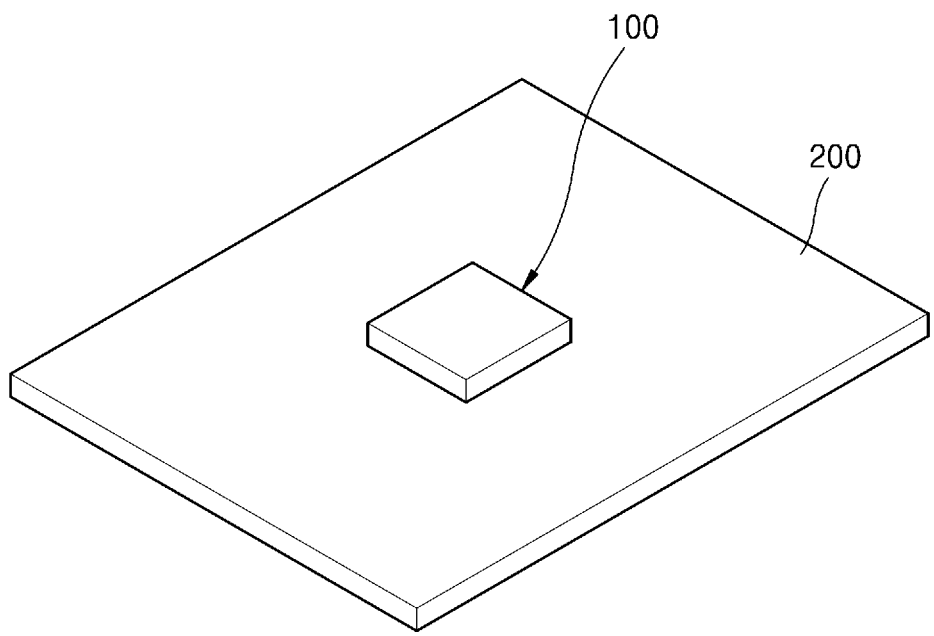
FIG. 11 illustrates an example of a microphone package mounted on a main board in an electronic apparatus according to an embodiment.

FIG. 11 illustrates an example of the microphone package 100 mounted on the main board 200 in an electronic apparatus according to an embodiment. Referring to FIG. 11, the microphone package 100 is mounted on the main board 200 in a parallel direction. In this case, the second electrode pads 152 formed on the rear surface 110*b* of the substrate 110 of the microphone package 100 may be provided to contact the main board 200.

Figure 12:
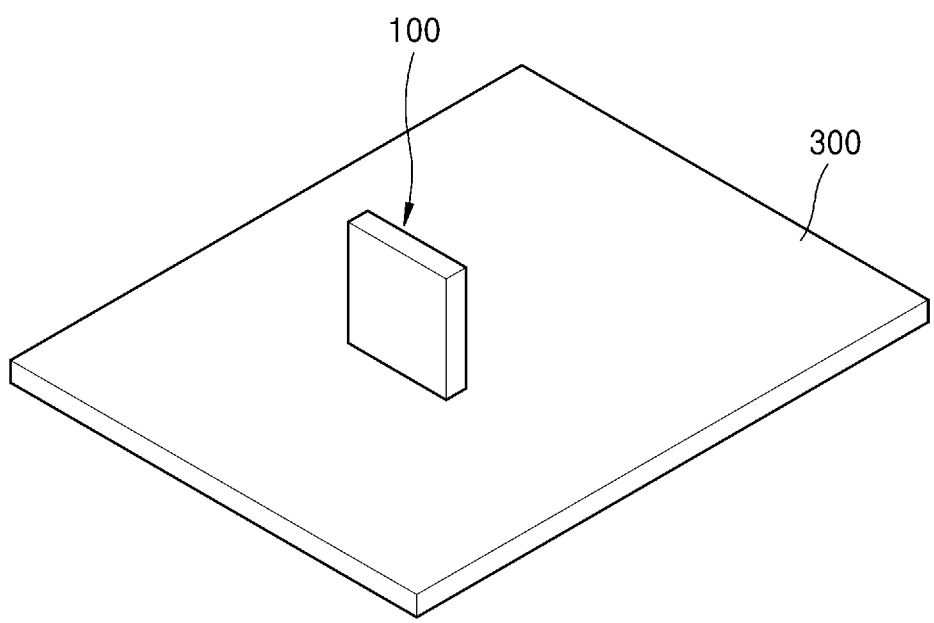
FIG. 12 illustrates another example of a microphone package mounted on a main board in an electronic apparatus according to an embodiment.

FIG. 12 illustrates another example of the microphone package 100 mounted on a main board 300 in an electronic apparatus according to an embodiment. Referring to FIG. 12, the microphone package 100 is mounted in a direction perpendicular to the main board 300. In this case, the third electrode pads 153 formed on the side surface 110*c* of the substrate 110 of the microphone package 100 may be provided to contact the main board 300.

A microphone package according to the related art may be mounted in only one from among a direction parallel to and a direction perpendicular to a main board of an electronic apparatus. For example, when the microphone package is mounted in the direction parallel to the main board, because a foot print occupied by the microphone package increases, there may be restrictions in application to a small electronic apparatus such as a wearable device. In addition, when the microphone package is mounted in the direction perpendicular to the main board, there is a problem in that a socket needs to be separately provided on the main board in order to fasten the microphone package.

The microphone package 100 according to an embodiment includes the first electrode pads 151, the second electrode pads 152, and the third electrode pads 153 electrically connected to each other on the front surface 110*a*, the rear surface 110*b*, and the side surface 110*c* of the substrate 110, respectively, and thus the microphone package 100 may be mounted in the direction parallel to the main board 200 of the electronic apparatus or may be mounted in the direction perpendicular to the main board 300. Accordingly, the microphone package 100 according to an embodiment may be selectively mounted in the direction parallel to the main board 200 or in the direction perpendicular to the main board 300 according to a type of electronic apparatus applied thereto. For example, in a small electronic apparatus such as a wearable device, the microphone package 100 may be mounted in the direction perpendicular to the main board 300, and in another electronic apparatus, the microphone package 100 may be mounted in the direction parallel to the main board 200.

Figure 13:
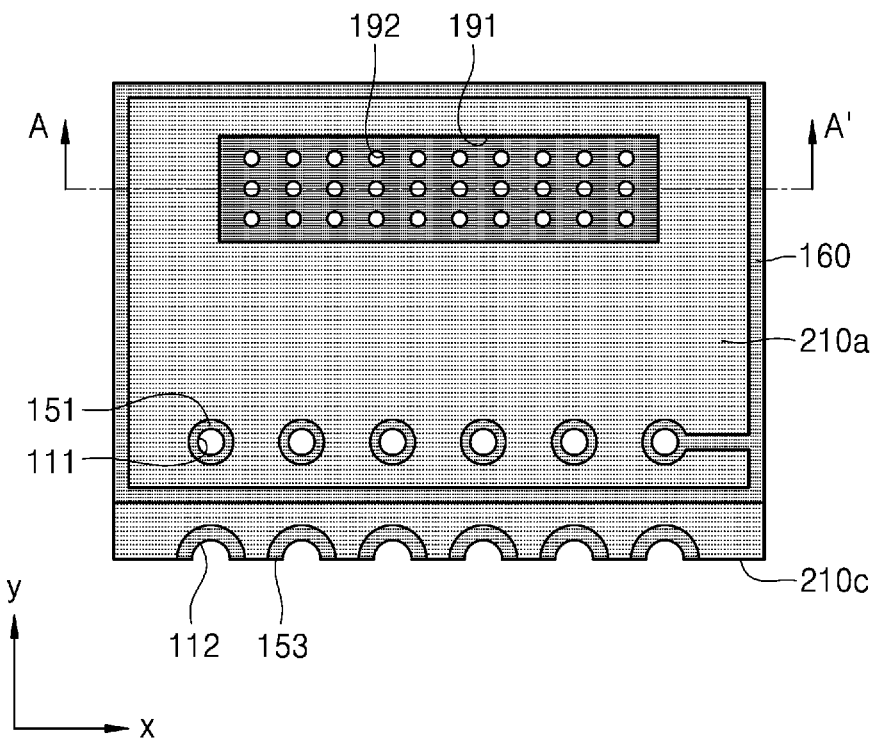
FIG. 13 is a front view illustrating a substrate of a microphone package according to another embodiment.
Figure 14:
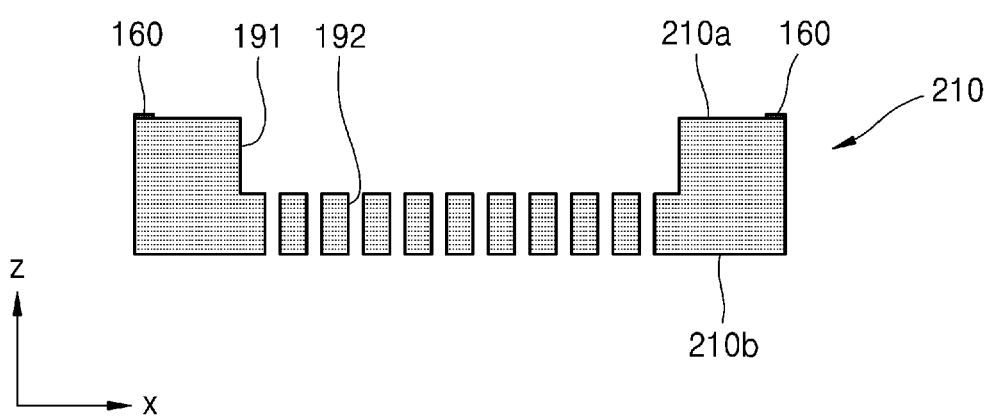
FIG. 14 is a cross-sectional view taken along a line A-A' of FIG. 13.
Figure 15:
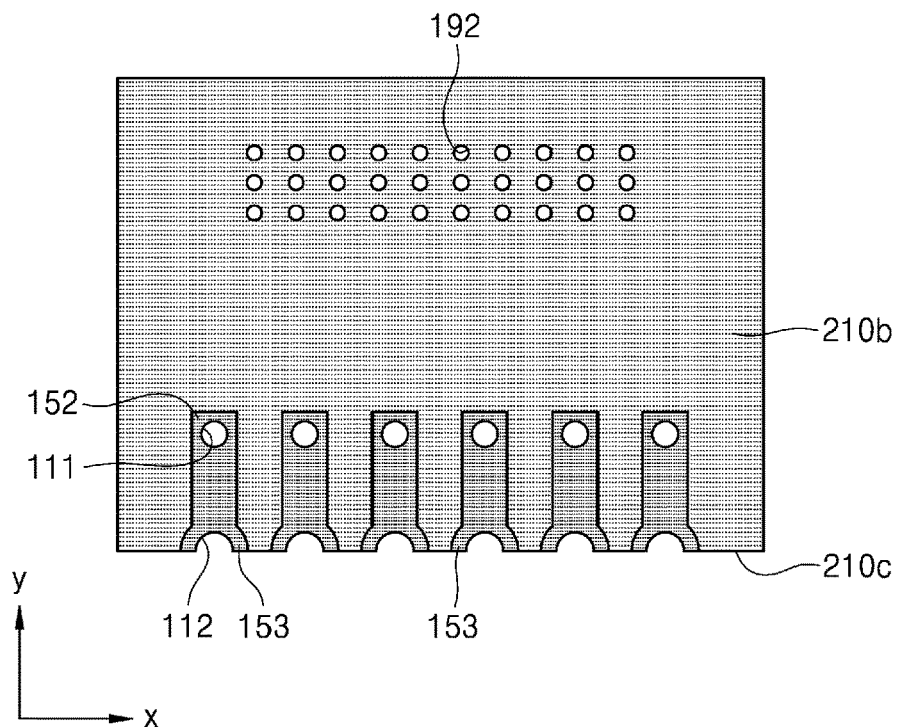
FIG. 15 is a rear view of the substrate shown in FIG. 13.

FIG. 13 is a front view illustrating a substrate 210 of a microphone package according to another embodiment. FIG. 14 is a cross-sectional view taken along line A-A' of FIG. 13. FIG. 15 is a rear view of the substrate 210 shown in FIG. 13.

Referring to FIGS. 13 to 15, an acoustic hole forming a sound path in a region to which the acoustic sensor (acoustic sensor 120 of FIG. 1) is attached is formed in the substrate 210. In the present embodiment, the acoustic hole may include a plurality of through holes 192 arranged by a certain distance in array form. As described above, the acoustic hole is formed as the plurality of small through holes 192 rather than a single large through hole, thereby preventing external impurity particles from flowing into the microphone package, and thus the reliability of the microphone package may be improved.

A trench 191 may be formed in a front surface 210*a* of the substrate 210 to a certain depth, in a region to which the acoustic sensor 120 is attached. As will be described below, the acoustic sensor 120 is attached to the trench 191, and thus the height of the microphone package may be reduced by the depth of the trench 191, thereby implementing the microphone package of a more compact structure.

The plurality of first via holes 111 are formed through the substrate 210. The first electrode pads 151 are provided on the front surface 210*a* of the substrate 210 around each of the first via holes 111, and the second electrode pads 152 are provided on a rear surface 210*b* of the substrate 210 around each of the first via holes 111. The first electrode pads 151 and the second electrode pads 152 may be provided to be electrically connected to each other by a conductive material filling the inside of each of the first via holes 111. The plurality of second via holes 112 are formed in a side surface 210*c* of the substrate 210, and the third electrode pads 153 are respectively provided inside each of the second via holes 112.

The first electrode pads 151 provided on the front surface 210*a* of the substrate 210 may be electrically connected to the second electrode pads 152 provided on the rear surface 210*b* of the substrate 210 through the first via holes 111. In addition, the second electrode pads 152 provided on the rear surface 210*b* of the substrate 210 may be electrically connected to the third electrode pads 153 provided on the side surface 210*c* of the substrate 210. Accordingly, the first electrode pads 151 may be electrically connected to the third electrode pads 153 through the second electrode pads 152.

The ground pattern 160 may be provided on the front surface 210*a* of the substrate 210 to surround the acoustic hole including the plurality of through holes 192 and the first via holes 111, and may be electrically connected to some of the first electrode pads 151 formed on the front surface 210*a* of the substrate 210.

Figure 16:
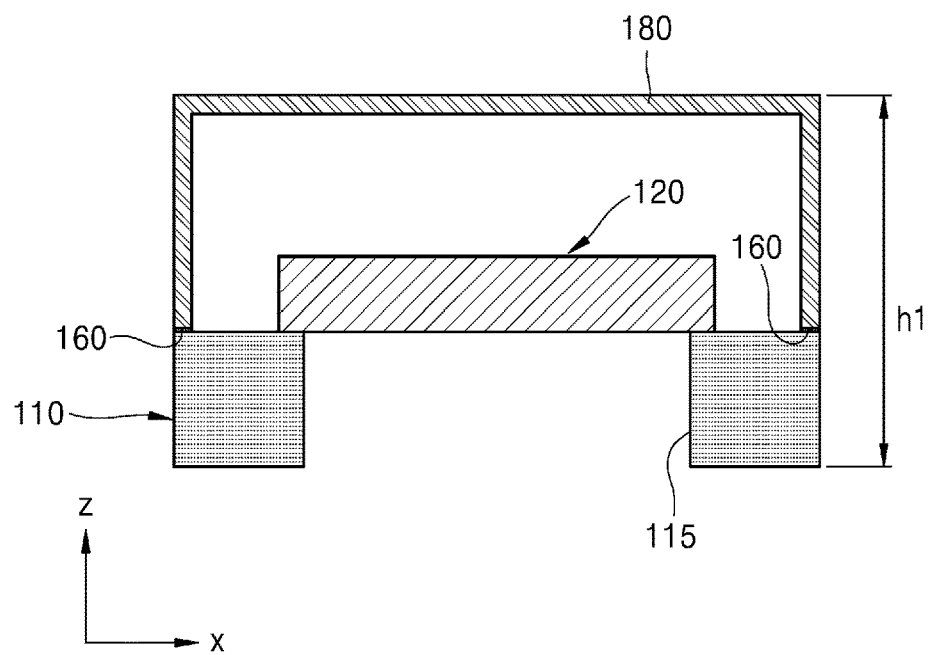
FIG. 16 is a cross-sectional view illustrating an acoustic sensor attached to a front surface of the substrate shown in FIG. 1, and a cap provided to cover the acoustic sensor.

FIG. 16 is a cross-sectional view illustrating the acoustic sensor 120 attached to a front surface of the substrate 110 shown in FIG. 1, and the cap 180 provided to cover the acoustic sensor 120.

Referring to FIG. 16, the acoustic hole 115 is formed in a region to which the acoustic sensor 120 is attached in the substrate 110, and the acoustic hole 115 includes a single large through hole. The acoustic sensor 120 is attached to the front surface of the substrate 110 so as to cover the acoustic hole 115. Here, a lower surface of the acoustic sensor 120 may be provided to contact the front surface of the substrate 110. In addition, the cap 180 is attached to the front surface of the substrate 110 so as to cover the acoustic sensor 120.

Figure 17:
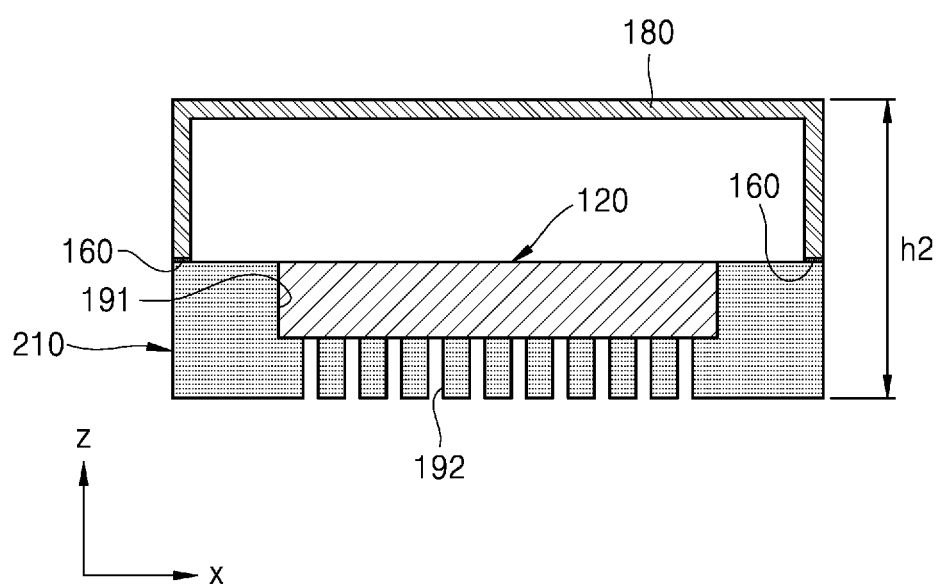
FIG. 17 is a cross-sectional view illustrating an acoustic sensor attached to a front surface of the substrate shown in FIG. 13, and a cap provided to cover the acoustic sensor.

FIG. 17 is a cross-sectional view illustrating the acoustic sensor 120 attached to a front surface of the substrate 210 shown in FIG. 13, and the cap 180 provided to cover the acoustic sensor 120.

Referring to FIG. 17, an acoustic hole is formed in a region to which the acoustic sensor 120 is attached in the substrate 210, and includes the plurality of small through holes 192. In addition, the trench 191 is formed in the front surface of the substrate 210 to a certain depth in the region in which the acoustic sensor 120 is formed. The acoustic sensor 120 is attached to the inside of the trench 191 formed in the front surface of the substrate 210. Here, a lower surface of the acoustic sensor 120 may be provided to contact a bottom surface of the trench 191. In addition, the cap 180 is attached to the front surface of the substrate 210 so as to cover the acoustic sensor 120.

Referring to FIGS. 16 and 17, a height h2 of a microphone package shown in FIG. 17 may be smaller than a height h1 of a microphone package shown in FIG. 16 by the depth of the trench 191. Accordingly, the microphone package shown in FIG. 17 may be manufactured to have a more compact structure than that of the microphone package shown in FIG. 16.

The case where the acoustic hole includes the plurality of through holes 192 and the trench 191 is formed in the front surface of the substrate 210 to the certain depth is described above, but even when the acoustic hole includes a single through hole, the trench 191 may be formed on the front surface of the substrate 210 to the certain depth.

The microphone package according to the embodiments above include the first, second, and third electrode pads electrically connected to each other on the front surface, the rear surface, and the side surface of the substrate so that the microphone package may be mounted in a direction parallel to the main board of the electronic apparatus or in a direction perpendicular to the main board. Accordingly, the microphone package may be selectively mounted in the direction parallel to the main board or in the direction perpendicular to the main board according to a type of the applied electronic apparatus. For example, in a small electronic apparatus such as a wearable device, the microphone package may be mounted in the direction perpendicular to the main board, and in another electronic apparatus, the microphone package may be mounted in the direction parallel to the main board. Although embodiments have been described above, these embodiments are merely examples, and various modifications are possible thereto by those of ordinary skill in the art.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure.

What is claimed is:

1. A microphone package comprising:
   a substrate in which an acoustic hole and a via hole are formed, the via hole extending through the substrate from a front surface of the substrate to a rear surface of the substrate;
   an acoustic sensor attached to the front surface of the substrate and covering the acoustic hole;
   a first electrode pad provided on the front surface of the substrate;
   a second electrode pad provided on the rear surface of the substrate and electrically connected to the first electrode pad through the via hole; and
   a third electrode pad provided on a side surface of the substrate and electrically connected to the second electrode pad.

2. The microphone package of claim 1, further comprising a ground pattern provided on the front surface of the substrate and surrounding the acoustic hole and the via hole, the ground pattern being electrically connected to the first electrode pad.

3. The microphone package of claim 2, further comprising a cap provided on the front surface of the substrate and covering the acoustic sensor.

4. The microphone package of claim 3, wherein the cap comprises a conductive material and is electrically connected to the ground pattern.

5. The microphone package of claim 1, wherein the substrate comprises an insulating material.

6. The microphone package of claim 1, further comprising a sensor control chip provided on the front surface of the substrate, the sensor control chip being configured to transmit and receive an electrical signal to and from the acoustic sensor.

7. The microphone package of claim 6, wherein the sensor control chip is electrically connected to the first electrode pad.

8. The microphone package of claim 1, wherein the acoustic hole comprises a plurality of through holes arranged in an array.

9. The microphone package of claim 1, wherein a trench is formed in the front surface of the substrate, and the acoustic sensor is provided in the trench.

10. The microphone package of claim 1, wherein the acoustic sensor comprises a directional acoustic sensor.

11. The microphone package of claim 10, wherein the directional acoustic sensor comprises:
    a support; and
    a plurality of resonators that extend from the support in a longitudinal direction.

12. The microphone package of claim 11, wherein a cavity is formed through the support, and the plurality of resonators are arranged in the cavity.

13. The microphone package of claim 11, wherein each resonator of the plurality of resonators has a resonant frequency that is different from resonant frequencies of other resonators of the plurality of resonators.

14. The microphone package of claim 13, wherein each resonator of the plurality of resonators has at least one dimension that is different from dimensions of other resonators of the plurality of resonators.

15. An electronic apparatus comprising:
    a main board; and
    a microphone package mounted on the main board,
    wherein the microphone package comprises:
        a substrate in which an acoustic hole and a via hole are formed, the via hole extending through the substrate from a front surface of the substrate to a rear surface of the substrate;
        an acoustic sensor attached to the front surface of the substrate and covering the acoustic hole;
        a first electrode pad provided on the front surface of the substrate;
        a second electrode pad provided on the rear surface of the substrate and electrically connected to the first electrode pad through the via hole; and
        a third electrode pad provided on a side surface of the substrate and electrically connected to the second electrode pad.

16. The electronic apparatus of claim 15, wherein the microphone package is mounted in a direction parallel to the main board.

17. The electronic apparatus of claim 16, wherein the second electrode pad is in contact with the main board.

18. The electronic apparatus of claim 15, wherein the microphone package is mounted in a direction perpendicular to the main board.

19. The electronic apparatus of claim 18, wherein the third electrode pad contacts the main board.

20. The electronic apparatus of claim 15, wherein the microphone package further comprises a ground pattern provided on the front surface of the substrate and surrounding the acoustic hole and the via hole, the ground pattern being electrically connected to the first electrode pad.

21. The electronic apparatus of claim 20, wherein the microphone package further comprises a cap provided on the front surface of the substrate and covering the acoustic sensor.

22. The electronic apparatus of claim 15, wherein the microphone package further comprises a sensor control chip provided on the front surface of the substrate, the sensor control chip being configured to transmit and receive an electrical signal to and from the acoustic sensor.

23. The electronic apparatus of claim 15, wherein the acoustic hole comprises a plurality of through holes arranged in an array.

24. The electronic apparatus of claim 15, wherein a trench is formed in the front surface of the substrate to a depth, and the acoustic sensor is within the trench.

25. The electronic apparatus of claim 15, wherein the acoustic sensor comprises a directional acoustic sensor.

26. The electronic apparatus of claim 25, wherein the directional acoustic sensor comprises:
 a support; and
 a plurality of resonators that extend from the support in a longitudinal direction.

27. The electronic apparatus of claim 26, wherein each resonator of the plurality of resonators has a resonant frequency that is different from resonant frequencies other resonators of the plurality of resonators.

28. The electronic apparatus of claim 15, wherein the electronic apparatus is an earphone, a headphone, a smart phone, a tablet PC, a television (TV), a virtual reality (VR) apparatus, an augmented reality (AR) apparatus, or an artificial intelligence (AI) speaker.

\* \* \* \* \*